United States Patent [19]
Ramsbey et al.

[11] Patent Number: 6,001,713
[45] Date of Patent: Dec. 14, 1999

[54] METHODS FOR FORMING NITROGEN-RICH REGIONS IN A FLOATING GATE AND INTERPOLY DIELECTRIC LAYER IN A NON-VOLATILE SEMICONDUCTOR MEMORY DEVICE

[75] Inventors: Mark T. Ramsbey, Sunnyvale; Vei-Han Chan; Sameer Haddad, both of San Jose; Chi Chang, Redwood City; Yu Sun, Saratoga; Raymond Yu, Cupertino, all of Calif.

[73] Assignee: Advanced Micro Devices, Inc., Sunnyvale, Calif.

[21] Appl. No.: 09/154,074

[22] Filed: Sep. 16, 1998

[51] Int. Cl.[6] .................................................. H01L 21/265
[52] U.S. Cl. ........................... 438/520; 438/257; 438/263; 438/266; 438/528
[58] Field of Search ..................................... 438/162, 257, 438/263, 264, 266, 407, 520, 528, 659, 660, 922

[56] References Cited

U.S. PATENT DOCUMENTS

| | | | |
|---|---|---|---|
| 4,682,407 | 7/1987 | Wilson et al. | 438/162 |
| 4,740,481 | 4/1988 | Wilson et al. | 438/660 |
| 4,774,197 | 9/1988 | Haddad et al. | 438/585 |
| 4,897,368 | 1/1990 | Kobushi et al. | 438/659 |
| 4,914,046 | 4/1990 | Tobin et al. | 438/659 |
| 5,192,707 | 3/1993 | Hodges et al. | 438/448 |
| 5,464,792 | 11/1995 | Tseng et al. | 438/585 |
| 5,712,208 | 1/1998 | Tseng et al. | 438/287 |
| 5,880,008 | 3/1999 | Akiyama et al. | 438/585 |

OTHER PUBLICATIONS

Yang et al. "Characteristics of Top–Gate Thin–Film Transistors Babricated on Nitrogen–Implanted Polysilicon Films," IEEE Trans. Electron Device, vol. 42. No. 12, 2163–2169, Dec. 1995.

*Primary Examiner*—Charles Bowers
*Assistant Examiner*—Jack Chen

[57] ABSTRACT

Methods are provided for significantly reducing electron trapping in semiconductor devices having a floating gate and an overlying dielectric layer. The methods form a nitrogen-rich region within the floating gate near the interface to an overlying dielectric layer. The methods include selectively introducing nitrogen into the floating gate prior to forming the overlying dielectric layer. This forms an initial nitrogen concentration profile within the floating gate. An initial portion of the overlying dielectric layer is then formed of a high temperature oxide (HTO). The temperature within the floating gate is purposely raised to an adequately high temperature to cause the initial nitrogen concentration profile to change due to the migration of the majority of the nitrogen towards the interface with the overlying dielectric layer and an interface with an underlying layer. Consequently, the floating gate is left with a first nitrogen-rich region near the interface to the overlying dielectric layer and a second nitrogen-rich region near the interface to the underlying layer. The first nitrogen-rich region has been found to reduce electron trapping within the floating gate, which could lead to false programming of the floating gate. Unlike a conventional thermally grown oxide film, the high temperature oxide film within the interpoly dielectric layer advantageously prevents the surface of the floating gate from becoming too granular. As such, the resulting interpoly dielectric layer, which typically includes several films, can be formed more evenly.

11 Claims, 5 Drawing Sheets

FIG. 4 (PRIOR TO ANNEAL)

FIG. 5 (AFTER ANNEAL)

METHODS FOR FORMING NITROGEN-RICH REGIONS IN A FLOATING GATE AND INTERPOLY DIELECTRIC LAYER IN A NON-VOLATILE SEMICONDUCTOR MEMORY DEVICE

FIELD OF THE INVENTION

The present invention relates to semiconductor devices and manufacturing processes, and more particularly to methods for effectively reducing false programming within non-volatile memory semiconductor devices that can occur as a result of electron trapping near the interface between a floating gate and an interpoly dielectric layer.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

Figure 1A:
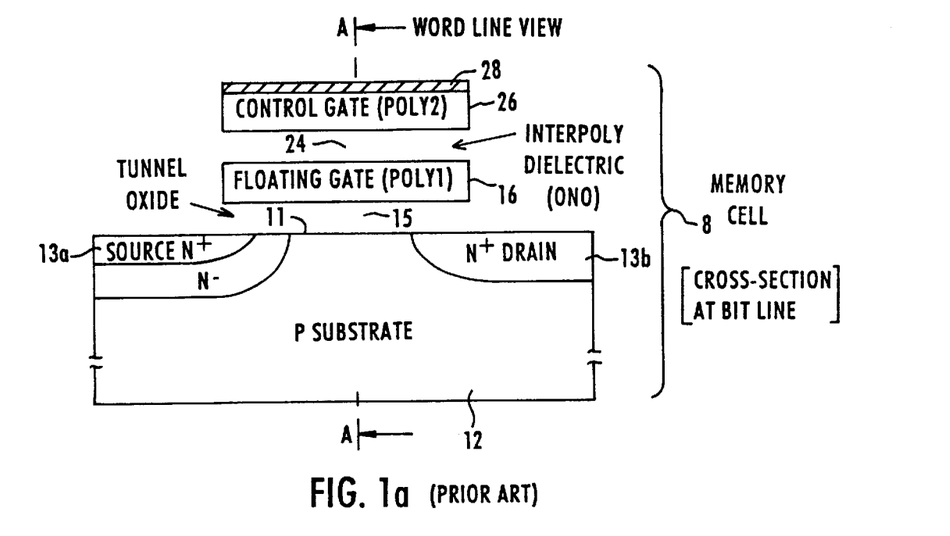
FIG. 1a depicts a cross-sectional view of a portion of a typical prior art semiconductor device having at least one memory cell, as viewed at the bit-line.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge needs to be removed from floating gate 16 by way of an erasure voltage applied to source 13a.

Figure 1B:
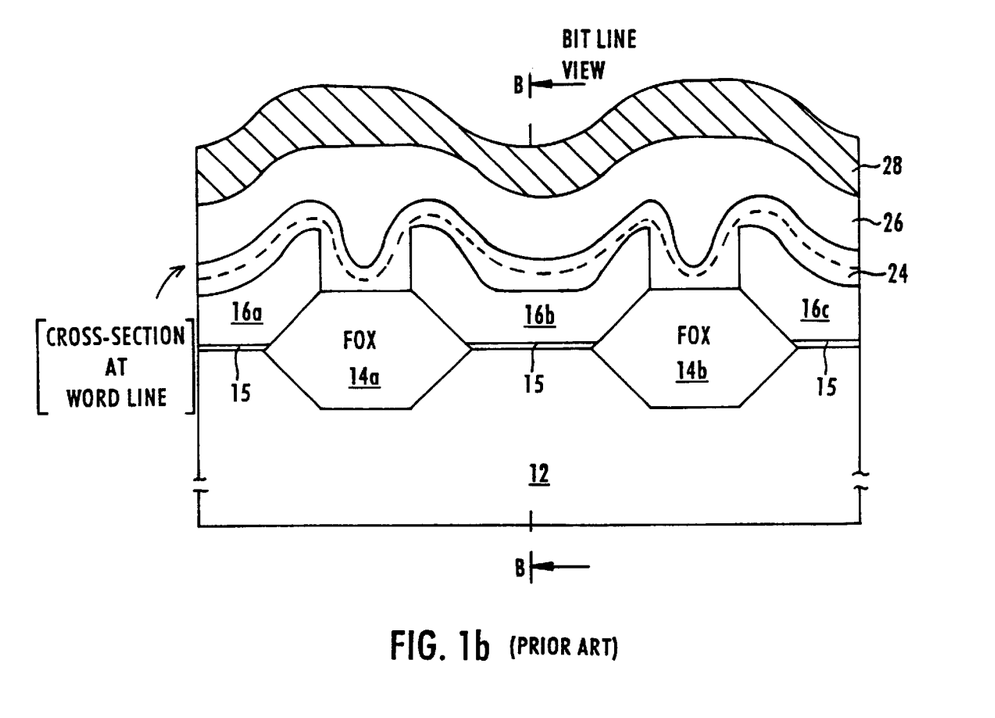
FIG. 1b depicts a cross-sectional view of a portion of a typical prior art semiconductor device, as in FIG. 1a, having at least one memory cell, as viewed at the word-line.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer. The thickness and physical properties of interpoly dielectric layer 24 affect the data retention capabilities of memory cell 8.

The continued shrinking of the memory cells, for example, as depicted in the memory cells of FIGS. 1a–b, requires that floating gates 16a–c be reduced in size (e.g., reduced width, length and/or height). The resulting reduced-size memory cell is typically operated with an attendant reduction in the threshold level of electrical charge that is required to program floating gate 16 to a binary 1 state. By way of example, in certain reduced-size memory cells, a binary 1 state can be represented by the electrical charge provided by as few as 5,000 electrons stored within floating gate 16. Consequently, there is a potential for false programming of the memory cell if an appropriate number of unwanted free electrons are allowed to migrate into, or otherwise charge, floating gate 16. In particular, it has been found that in certain memory cells electrons can be trapped near the interface between the floating gate 16 and the overlying interpoly dielectric layer 24 during fabrication. In certain instances, these trapped electrons can escape from the trapping mechanism, for example, due to subsequent thermal changes and/or the passage of time. Once released, these unwanted electrons can falsely program floating gate 16 (e.g., to a binary 1 state). Thus, there is need for methods for fabricating semiconductor devices that effectively reduce the potential for electron trapping, and/or false programming as a result thereof, at or near the interface between floating gate 16 and interpoly dielectric layer 24.

SUMMARY OF THE INVENTION

These needs and others are met by the present invention, which in accordance with certain aspects, provides methods for fabricating semiconductor devices that effectively reduce the potential for electron trapping in a polysilicon or amorphous silicon feature in a semiconductor device by advantageously employing a nitrogen-rich region within the feature near the interface between the feature and an overlying dielectric layer. Because the nitrogen-rich region significantly reduces the electron-trap density near this interface, the resulting semiconductor device is much less likely to be falsely programmed or otherwise significantly affected due to the subsequent release of trapped electrons. In accordance with still further aspects of the present invention, improved fabrication techniques are employed to produce a high quality dielectric layer over the feature.

Thus, in accordance with certain embodiments of the present invention a method for forming a semiconductor device is provided. The method includes forming a first dielectric layer, forming a first gate on the first dielectric layer, introducing nitrogen into the first gate, forming at least a portion of a second dielectric layer on the first gate with a high temperature oxide (HTO), and forming a first nitrogen-rich region within the first gate and substantially adjacent to the first dielectric layer, and a second nitrogen-rich region within the first gate and substantially adjacent the second dielectric layer. In certain embodiments, the first gate includes either polysilicon and/or amorphous silicon.

In accordance with certain further embodiments of the present invention, the step of introducing nitrogen into the first gate includes implanting nitrogen ions into the first gate, the implanted nitrogen ions forming a first nitrogen concentration profile within the first layer, and the step of forming the first and second nitrogen-rich regions includes causing the first nitrogen concentration profile to be altered to form a second nitrogen concentration profile within the first gate. The second nitrogen concentration profile includes the first nitrogen-rich region and the second nitrogen-rich region. The second nitrogen concentration profile can also include a reduced-nitrogen region that is located between the first nitrogen-rich region and the second nitrogen-rich region. The reduced-nitrogen region has a lower concentration of nitrogen than the first nitrogen-rich region and the second nitrogen-rich region.

By way of example, in accordance with still further embodiments of the present invention, the step of causing the first nitrogen concentration profile to be altered includes causing the first nitrogen-rich region to include between about 0.01% and about 1% atomic percentage of nitrogen, causing the second nitrogen-rich region to include between about 0.01% and about 1% atomic percentage of nitrogen, and/or causing the lower concentration of nitrogen in the reduced-nitrogen region to include less than about 0.001% atomic percentage of nitrogen.

In accordance with certain other embodiments of the present invention, the step of forming at least a portion of a second dielectric layer on the first gate includes forming a high temperature oxide (HTO) film on the first gate, following the step of introducing nitrogen into the first gate. The step of forming at least a portion of a second dielectric layer on the first gate further can also include forming a silicon nitride film on the high temperature oxide (HTO) film and subsequently forming a silicon dioxide film on the silicon nitride film.

In accordance with still other embodiments of the present invention, the step of introducing nitrogen into the first gate includes the step of thermally diffusing nitrogen into the first gate. The diffused nitrogen forms a first nitrogen concentration profile within the first layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 2A:
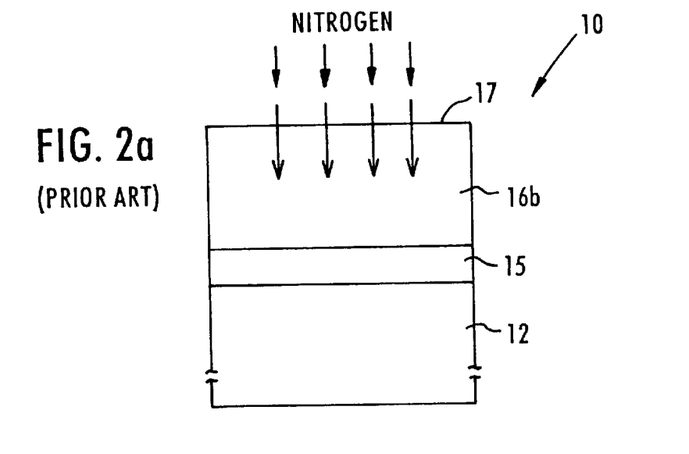
FIG. 2a depicts an enlarged cross-sectional view of part of a conventional floating gate as depicted, for example, in the portion of FIG. 1b, following the formation of a polysilicon or amorphous silicon feature into which nitrogen is implanted or otherwise deposited.

FIG. 2a depicts an enlarged cross-sectional view of a portion 10 of a conventional semiconductor device having a floating gate 16b as depicted, for example, in the portion of FIG. 1b. Floating gate 16b is formed by depositing polysilicon or amorphous silicon, for example, by chemical vapor deposition (CVD), plasma enhanced chemical vapor deposition (PECVD), or the like. At some point in the fabrication process, floating gate 16b is selectively doped to conduct electricity and selectively patterned using known doping and patterning techniques, respectively.

After floating gate 16b has been formed, nitrogen is implanted or otherwise deposited into floating gate 16b. There are several advantages to having one or more nitrogen-rich regions within floating gate 16b. For example, U.S. Pat. No. 4,774,197, describes implanting nitrogen ions to prevent the incursion of impurities into the tunnel oxide, which would degrade the quality of the tunnel oxide.

One of the aspects of the present invention concerns the changes to floating gate 16b that occur as a result of introduction of nitrogen ions directly into floating gate 16b. As described below, the surface of floating gate 16b is usually altered by the introduction of nitrogen. Consequently, a subsequently grown oxide is substantially thinner and/or has a greater number of defects.

Figure 2B:
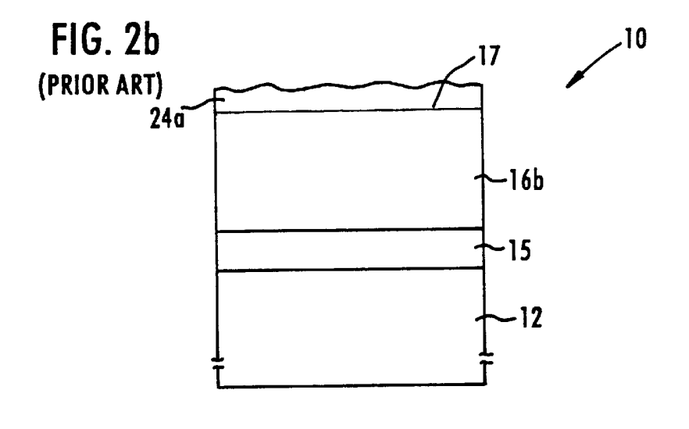
FIG. 2b depicts the portion as in FIG. 2a following subsequent formation of a thermally grown first silicon dioxide film on the top surface of the feature, in which the first silicon dioxide film has defects or reduced thickness due to the presence of nitrogen in the underlying gate.

FIG. 2b depicts the portion as in FIG. 2a following subsequent formation of a thermally grown first silicon dioxide film 24a (e.g., about 50 Angstroms thick) on floating gate 16b. First silicon dioxide film 24a is essentially the first of three layers that, together, form interpoly dielectric layer 24. It has been found that thermal oxidation of the first silicon dioxide film 24a varies in thickness and has a greater number of defects. Nitrogen causes subsequently grown oxides to be thinner and have a greater number of defects.

Figure 2C:
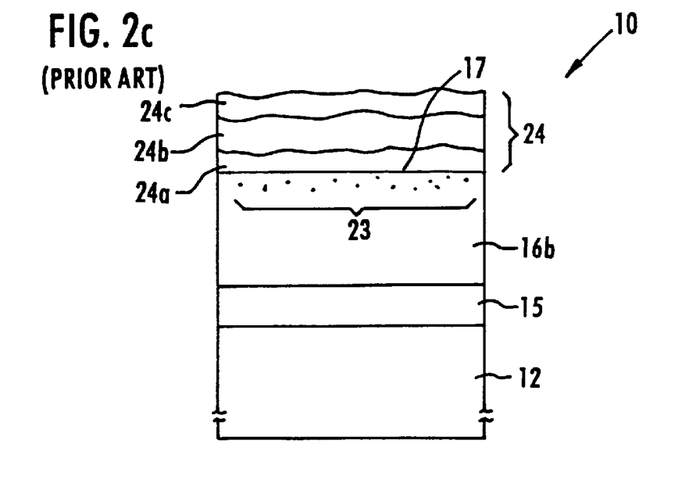
FIG. 2c depicts the enlarged view of FIG. 2b, following subsequent formation of a silicon nitride film on the thermally grown silicon dioxide film and a second silicon dioxide film on the silicon nitride film, thereby completing the formation of an ONO interpoly dielectric layer.

FIG. 2c depicts the enlarged view of FIG. 2b, following subsequent formation of a silicon nitride film 24b (e.g., about 80 Angstroms thick) on first silicon dioxide film 24a, and a second silicon dioxide file 24c (e.g., about 40 Angstroms thick) on silicon nitride film 24b, thereby completing the formation of an ONO interpoly dielectric layer 24. Silicon nitride film 24b is typically formed using conventional chemical vapor deposition (CVD) or other like deposition techniques. Second silicon dioxide film 24c is then grown on silicon nitride film 24b, again using conventional thermal oxidation techniques. Since both silicon nitride film 24b and second silicon dioxide film 24c are conformal, they tend to be uneven like the underlying first silicon dioxide film 24a.

Thus, the resulting interpoly dielectric layer 24 tends to be uneven. The dielectric properties of an unevenly formed interpoly dielectric layer 24 can vary from one location to the next location within portion 10. In certain embodiments, the varying dielectric properties of interpoly dielectric layer 24 can be detrimental to the operation of the semiconductor device, such as, for example, a memory cell 8. Therefore, there is a further need for improved methods and arrangements which provide a smoother (e.g., more uniform) interpoly dielectric layer.

Before describing some of the further improvements to the art provided by the various embodiments of present invention, a description is provided of some additional reasons why nitrogen is preferably introduced into floating gate 16b.

It has been found that a plurality of trapped electrons 23 can form within floating gate 16b, at or near the interface to the overlying first silicon dioxide film 24a. It is believed that certain "defects" are introduced near the top surface 17 of floating gate 16b during the formation of the first silicon dioxide film 24a. These defects include the trapped electrons 23, and/or lead to the formation of mechanisms that trap electrons. It has also been found that the trapped electrons 23 cannot always be adequately removed during subsequent semiconductor device erase processes. Further, the trapped electrons 23 can break free of their trapping mechanisms during the lifetime of the semiconductor device and migrate away from the interface and into the interior regions of floating gate 16b. Thermal cycling of the semiconductor device, during the operational lifetime, tends to increase the likelihood for the migration of previously trapped electrons 23. Consequently, in certain semiconductor devices, especially reduced-size memory devices, this later migration of previously trapped electrons 23 can lead to false programming of floating gate 16b, thereby rendering the semiconductor device unreliable.

Introducing nitrogen into floating gate 16b, and forming one or more nitrogen-rich regions therein, however, tends to significantly reduce the density of trapped electrons within floating gate 16b at or near the interface to first silicon dioxide film 24a.

Figure 3A:
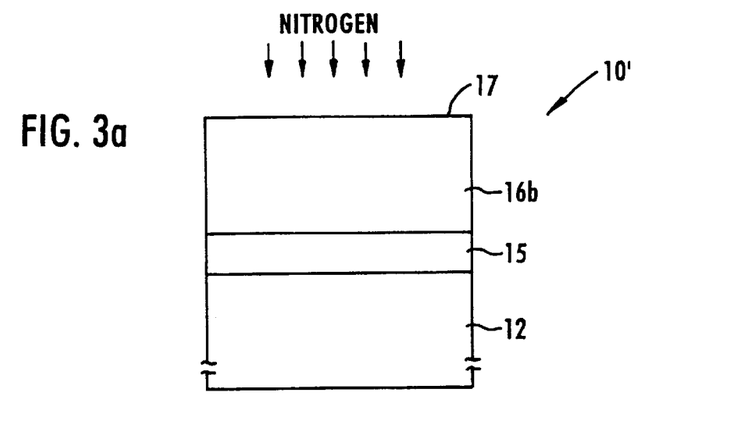
FIG. 3a depicts an enlarged view of a cross-section of a portion of a semiconductor device, such as that depicted in FIG. 2a, having a polysilicon or amorphous silicon feature into which nitrogen is implanted or otherwise deposited.

With this in mind, FIG. 3a depicts a cross-sectional view of a portion 10' of an exemplary semiconductor device, in accordance with certain embodiments of the present invention. Portion 10' includes a substrate 12, upon which a tunnel oxide 15 has been formed to a thickness of about 100 Angstroms, using conventional thermal oxidation techniques. A floating gate 16b', for example, a doped polysilicon or a doped amorphous silicon feature, is formed to a thickness of between about 400 and about 2000 Angstroms on tunnel oxide 15, again using conventional deposition, doping and patterning techniques. Preferably, the top surface 17 of floating gate 16b' is substantially planar at first. Nitrogen is introduced into floating gate 16b' using conventional ion implantation and/or thermal diffusion techniques.

Figure 3B:
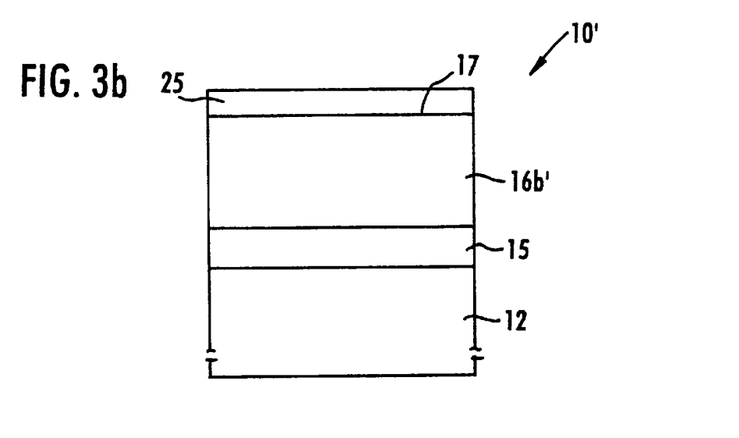
FIG. 3b depicts the portion as in FIG. 3a following subsequent formation of an improved first silicon dioxide film on the top surface of the feature using a high temperature oxide (HTO) formed using a chemical vapor deposition (CVD) or like process, in accordance with certain embodiments of the present invention.
Figure 3C:
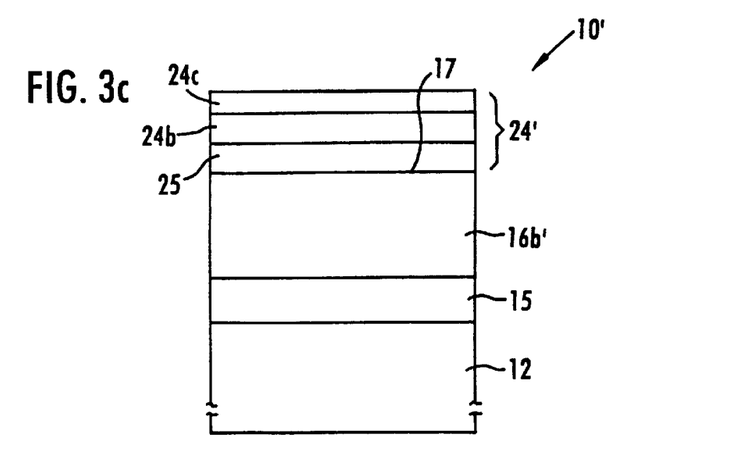
FIG. 3c depicts the enlarged view of FIG. 3b, following subsequent formation of a silicon nitride film on the improved silicon dioxide film and a second silicon dioxide film on the silicon nitride film, thereby completing the formation of an ONO interpoly dielectric layer, which, in accordance with certain embodiments of the present invention, is significantly planar.

FIG. 3b depicts the portion as in FIG. 3a following subsequent formation of an improved first silicon dioxide film 25 on the top surface 17 of floating gate 16b', in accordance with certain embodiments of the present invention. Improved first silicon dioxide film 25 is a high temperature oxide (HTO) that is formed using CVD, PECVD, or a like deposition process. Unlike a conventional thermal oxidation process, the HTO process is unaffected by nitrogen in the underlying floating gate. Consequently, improved first silicon dioxide film 25 is significantly more even (e.g., planar, uniform in thickness, etc.) than is a prior art thermally grown first silicon dioxide film 24a. Therefore, as depicted in FIG. 3c, subsequently formed silicon nitride film 24b and second silicon dioxide film 24c will each tend to form significantly smoothly, as well. As such, the resulting interpoly dielectric layer 24 is more smooth and the interpoly dielectric layer's dielectric properties are less likely to vary significantly from location to location within portion 10'.

In accordance with certain exemplary embodiments of the present invention, first silicon dioxide film 25 is formed to thickness of between about 20 and about 100 Angstroms on floating gate 16b' by conventional HTO processes that includes CVD or PECVD deposition techniques. By way of example an Alpha-8 deposition tool, available from Tokyo Electronics of Tokyo, Japan can be used to form first silicon dioxide film 25.

Next, a silicon nitride film 24b is formed on first silicon dioxide film 25 to thickness of between about 40 and about 200 Angstroms by conventional chemical vapor deposition CVD or like processes. This is followed by the formation of a second silicon dioxide film 24c having a thickness of between about 40 and about 200 Angstroms. Second silicon dioxide film 24c can be formed using conventional thermal oxide deposition, CVD, or other like processes.

While the exact mechanisms are not fully understood, it has been found that the density of trapped electrons 23 can be significantly reduced, if not substantially eliminated, by providing nitrogen near the interface of floating gate 16b' and first silicon dioxide 25. Thus, in accordance with certain exemplary embodiments of the present invention, prior to the formation of first silicon dioxide film 25, nitrogen ions are implanted into floating gate 16b'. For example, in accordance with certain exemplary embodiments of the present invention, an ion implantation energy of between about 10 and about 30 KeV in a dosage of between about $1 \times 10^{14}$ and about $1 \times 10^{16}$ ions/cm$^2$, and more preferably about $5 \times 10^{15}$ ions/cm$^2$, is used to implant nitrogen into floating gate 16b'.

The implantation of nitrogen into portion 10' creates an initial nitrogen concentration profile substantially within the floating gate 16b', in accordance with certain exemplary embodiments of the present invention.

Figure 4:
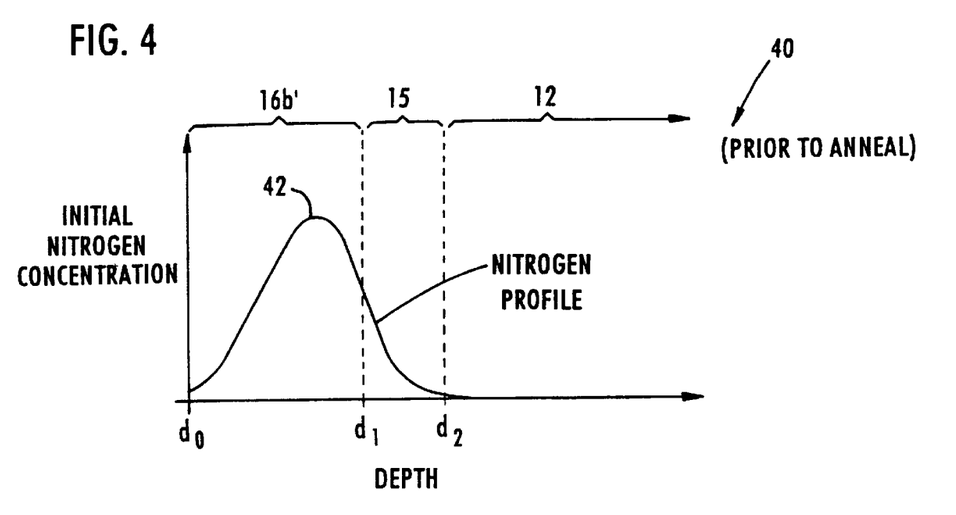
FIG. 4 is a graph depicting an initial nitrogen concentration profile as implanted or otherwise deposited within the portion as depicted, for example, in FIG. 3a, wherein the resulting nitrogen concentration profile has a bell shape that is substantially located within the thickness of the feature, in accordance with certain exemplary embodiments of the present invention.

By way of example, graph 40 in FIG. 4 depicts an initial nitrogen concentration profile 42, as is implanted within portion 10' in FIG. 3a, in accordance with certain preferred embodiments of the present invention. As shown, the resulting nitrogen concentration profile 42 has a higher concentration of nitrogen located substantially within the thickness of the floating gate 16b'. For example, the concentration of nitrogen, as measured as an atomic percentage of the material within floating gate 16b', is preferably between about 0.01% and about 1% percent and varies as a function of the thickness of floating gate 16b'.

Once floating gate 16b' has been implanted with nitrogen, a subsequent conventional thermal processing step is employed to alter the initial nitrogen concentration profile 42. The altering of the initial nitrogen concentration profile 42 allows the density of trapped electrons within the floating gate to be significantly reduced, and also increase its charge retention capabilities. The thermal processing step preferably raises the temperature within floating gate 16b' to between about 900 and about 1100 C. °, which causes the implanted nitrogen that is substantially within floating gate 16b' to migrate or to be otherwise repositioned substantially within floating gate 16b'.

Figure 5:
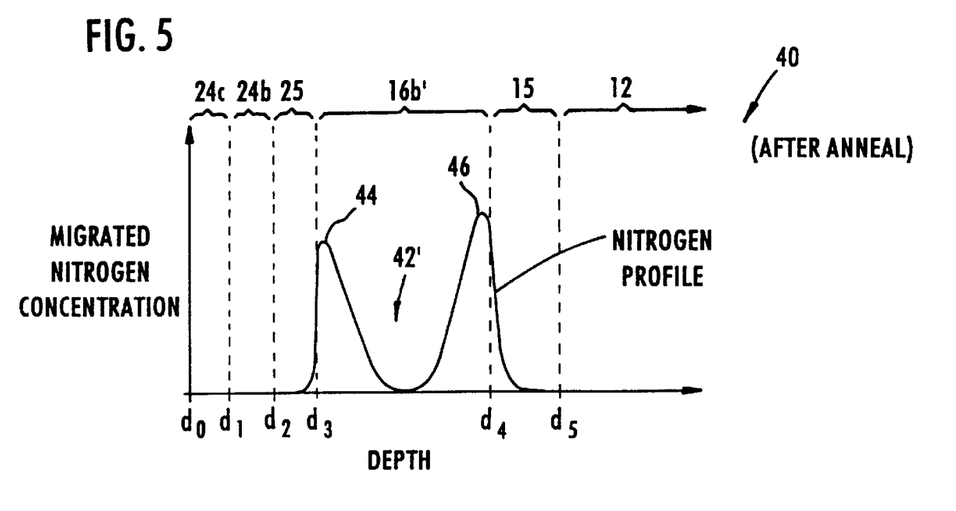
FIG. 5 is a graph, based on FIG. 4, depicting a migrated nitrogen concentration profile following subsequent thermal processing (e.g., a thermal anneal process) of the initial nitrogen concentration profile portion within the floating gate, wherein the graph clearly shows that the migrated nitrogen concentration profile includes a top nitrogen-rich region near the interface between the floating gate and the overlying first silicon dioxide film, and a bottom nitrogen-rich region near the interface between the floating gate and the underlying tunnel oxide, in accordance with certain exemplary embodiments of the present invention.

Graph 40 has been altered in FIG. 5 to depict a migrated nitrogen concentration profile 42' following subsequent thermal processing, for example, using conventional thermal anneal process techniques. It is preferred, although not necessary, that at least first silicon dioxide film 25 be formed prior to the thermal processing. In certain instances, the thermal process may include the HTO/CVD or other relevant processes used to form first silicon dioxide film 25, silicon nitride film 24b, and/or second silicon dioxide film 24c.

As shown in FIG. 5, migrated nitrogen concentration profile 42' includes a top nitrogen-rich region 44 near the interface between floating gate 16b' and the overlying first silicon dioxide film 25, and a bottom nitrogen-rich region 46 near the interface between floating gate 16b' and the underlying tunnel oxide 15, in accordance with certain exemplary embodiments of the present invention. In certain cases, substantially all of the implanted nitrogen within floating gate 16b' migrates towards either of these interfaces to form region 44 and/or 46, thereby leaving only a negligible concentration of nitrogen therebetween. By way of example, an exemplary anneal process employs a Centura available from Applied Materials of Santa Clara, Calif. to raise the temperature of floating gate 16b' to between about 900 and about 1100 C. ° for a period of between about 10 and about 60 seconds.

Figure 6:
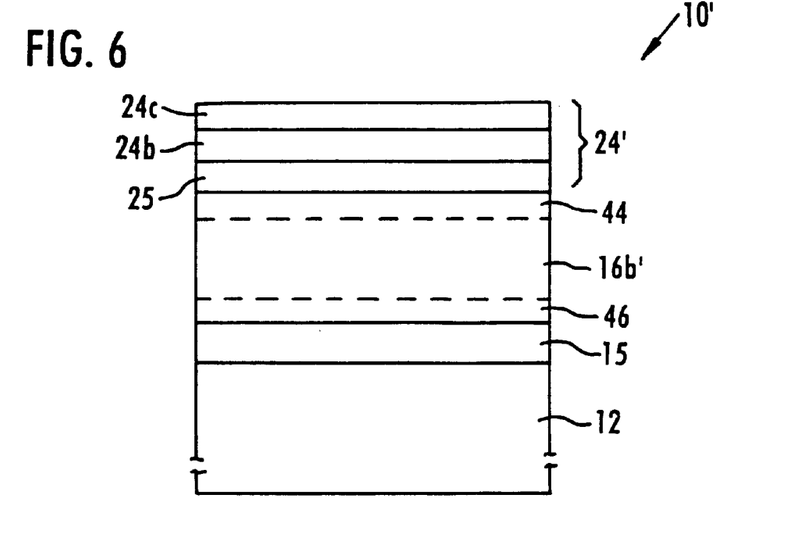
FIG. 6 depicts the portion of FIG. 3c having a migrated nitrogen concentration profile, for example, as depicted in FIG. 5, following thermal processing, which includes a top nitrogen-rich region near the interface between the floating gate and the overlying first silicon dioxide film, and a bottom nitrogen-rich region near the interface between the floating gate and the underlying tunnel oxide, in accordance with certain exemplary embodiments of the present invention.

The density of trapped electrons within floating gate 16b' is significantly reduced, if not substantially eliminated, due to top nitrogen-rich region 44, which is located near the interface of floating gate 16b' and first silicon dioxide 25 (for example, see FIG. 6). Further, bottom nitrogen-rich region 46 can, in certain semiconductor devices, increase the charge retention capabilities of floating gate 16b' and/or reduce electron trapping that can occur near the interface to tunnel oxide 15.

Figure 7:
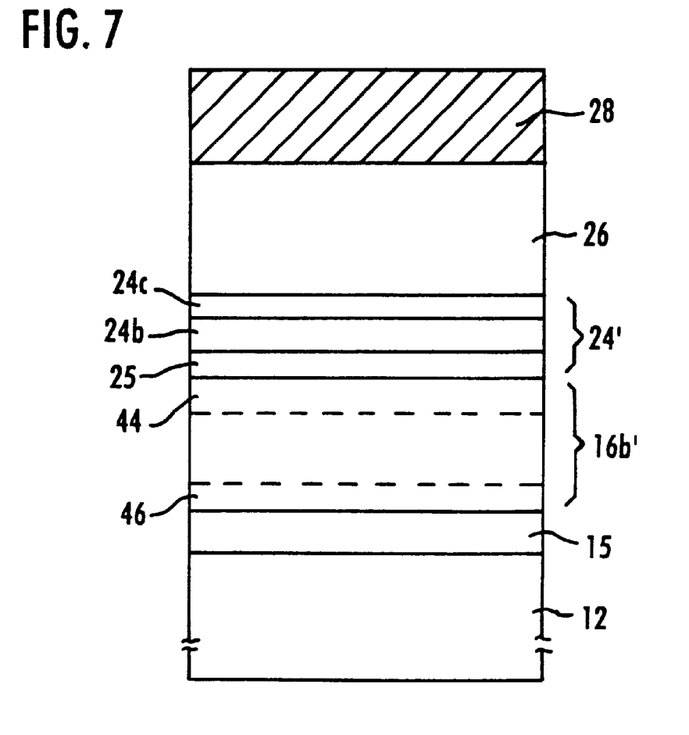
FIG. 7 depicts the portion of FIG. 6 following formation of a control gate and silicide layer over the interpoly dielectric layer, in accordance with certain exemplary embodiments of the present invention.

FIG. 7 depicts the portion of FIG. 6 following formation of a control gate 26 on interpoly dielectric layer 24', and a subsequently formed silicide layer 28 on control gate 26, using conventional deposition techniques.

By using an HTO process, first silicon dioxide film 25 can be produced without defects or reduction in thickness on the top surface of floating gate 16b', which has already been altered to some extent by the introduction of nitrogen into floating gate 16b'. This allows for the formation of a more "even" interpoly dielectric layer over the floating gate with significantly fewer trapped electrons therein.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a semiconductor device, the method comprising:

forming a first dielectric layer;

forming a first gate on the first dielectric layer;

implanting nitrogen ions into the first gate to form a first nitrogen concentration profile within the first gate; and forming at least a portion of a second dielectric layer on the first gate with a high temperature oxide (HTO), said step of forming at least a portion of a second dielectric layer on the first gate with a high temperature oxide (HTO) including raising a temperature of said first gate to alter the first nitrogen concentration profile to form a second nitrogen concentration profile within the first gate, the second nitrogen concentration profile comprising a first nitrogen-rich region within the first gate proximate to the first dielectric layer, a second nitrogen-rich region within the first gate proximate the second dielectric layer, and a reduced-nitrogen region within the first gate between the first nitrogen-rich region and the second nitrogen-rich region, the reduced-nitrogen region having a minimum concentration of nitrogen which is lower than the first nitrogen-rich region and the second nitrogen-rich region with the concentration of nitrogen substantially continuously rising from the minimum concentration of nitrogen of the reduced-nitrogen region to each of the first and second nitrogen-rich regions.

2. The method as recited in claim 1, wherein the first gate comprises polysilicon.

3. The method as recited in claim 1, wherein the first gate comprises amorphous silicon.

4. The method as recited in claim 1, wherein the step of raising a temperature of said first gate to alter the first nitrogen concentration profile to form a second nitrogen concentration profile within the first gate comprises raising a temperature of said first gate to between about 900 and about 1100 C. ° for a period of between about 10 and about 60 seconds.

5. The method as recited in claim 4, wherein the step of raising a temperature of said first gate to between about 900 and about 1100 C. ° for a period of between about 10 and about 60 seconds causes the first nitrogen-rich region to include between about 0.01% and about 1% atomic percentage of nitrogen.

6. The method as recited in claim 5, wherein the step of raising a temperature of said first gate to between about 900 and about 1100 C. ° for a period of between about 10 and about 60 seconds causes the second nitrogen-rich region to include between about 0.01% and about 1% atomic percentage of nitrogen.

7. The method as recited in claim 4, wherein the step of raising a temperature of said first gate to between about 900 and about 1100 C. ° for a period of between about 10 and about 60 seconds causes the minimum concentration of nitrogen in the reduced-nitrogen region to include less than about 0.001% atomic percentage of nitrogen.

8. The method as recited in claim 1, wherein the step of forming at least a portion of a second dielectric layer on the first gate includes forming the high temperature oxide (HTO) film on the first gate following the step of implanting nitrogen ions into the first gate.

9. The method as recited in claim 8, wherein the step of forming at least a portion of a second dielectric layer on the first gate further includes forming a silicon nitride film on the high temperature oxide (HTO) film.

10. The method as recited in claim 9, wherein the step of forming at least a portion of a second dielectric layer on the first gate further includes forming a silicon dioxide film on the silicon nitride film.

11. The method as recited in claim 4, wherein the step of implanting nitrogen ions into the first gate uses an ion implantation energy of between about 10 and about 30 KeV to provide a dosage of between about $1 \times 10^{14}$ and about $1 \times 10^{16}$ ions/cm$^2$.

* * * * *